United States Patent
Tahara

(10) Patent No.: US 7,071,754 B2
(45) Date of Patent: Jul. 4, 2006

(54) SEMICONDUCTOR INTEGRATED CIRCUIT AND MANUFACTURING METHOD

(75) Inventor: Hiroyuki Tahara, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 56 days.

(21) Appl. No.: 11/012,724

(22) Filed: Dec. 16, 2004

(65) Prior Publication Data

US 2005/0134353 A1    Jun. 23, 2005

(30) Foreign Application Priority Data

Dec. 17, 2003    (JP) .............................. 2003-420033

(51) Int. Cl.
*G06F 1/04*    (2006.01)

(52) U.S. Cl. ....................... 327/291; 327/293

(58) Field of Classification Search ........ 327/291–295, 327/297, 298; 716/13
See application file for complete search history.

(56) References Cited

U.S. PATENT DOCUMENTS 6,429,714 B1 * 8/2002 Schultz ....................... 327/291
6,538,489 B1    3/2003 Nakano ....................... 327/297

FOREIGN PATENT DOCUMENTS

| | | |
|---|---|---|
| JP | 09-269847 | 10/1997 |
| JP | 11-214517 | 8/1999 |
| JP | 2001-285055 | 10/2001 |

* cited by examiner

*Primary Examiner*—Linh My Nguyen
(74) *Attorney, Agent, or Firm*—Nath & Associates PLLC; Gregory B. Kang; Derek Richmond

(57) ABSTRACT

In order to provide a semiconductor integrated circuit equipped with a clock distribution circuit that enables clock skew to be reduced without requiring great effort and without being affected by temperature variations or voltage variations, and a manufacturing method thereof, in a clock distribution circuit 1 installed in a semiconductor integrated circuit, part of the distribution path of a clock signal that passes from a first selector 11 of a first circuit block 10 that has many buffer stages via a first buffer stage 10A is used, and a distribution path of a clock signal to a second buffer stage 20A of a second circuit block 20 that has few buffer stages is constructed.

4 Claims, 4 Drawing Sheets

1:CLOCK DISTRIBUTION CIRCUIT
2,3:CONNECTING WIRES
10:FIRST CIRCUIT BLOCK
11:FIRST SELECTOR
20:SECOND CIRCUIT BLOCK
21:SECOND SELECTOR
30:THIRD CIRCUIT BLOCK
31:THIRD SELECTOR
10A–10C:FIRST BUFFER STAGES
20A:SECOND BUFFER STAGE

4:SEMICONDUCTOR INTEGRATED CIRCUIT

SEMICONDUCTOR INTEGRATED CIRCUIT AND MANUFACTURING METHOD

BACKGROUND OF THE INVENTION

1. Field of the Invention

The present invention relates to a semiconductor integrated circuit and manufacturing method thereof, and more particularly to a semiconductor integrated circuit that has a clock distribution circuit and a manufacturing method thereof.

2. Description of the Related Art

Conventionally, in the development and manufacturing stages of an application specific integrated circuit (ASIC), clock skew is analyzed using a computer aided design (CAD) system, and clock skew is reduced based on the results of this analysis (see, for example, Unexamined Japanese Patent Publication No. HEI 9-269847). In clock skew analysis, a clock distribution circuit is used that has a buffer tree structure in which the system from the clock signal supply source to the flip-flops (buffers) in which clock signals are actually used is arranged in tree form.

FIG.4 shows the configuration of a typical clock distribution circuit used in clock skew analysis. The clock distribution circuit has a total of three circuit blocks 100, 200, and 300.

Circuit block 100 is the buffer tree that has the largest number of buffer stages (instances), and performs distribution to all areas of the semiconductor integrated circuit. A clock signal from the supply source is inputted to a mode switching selector 101, and this mode switching selector 101 distributes clock signal A1 in the case of mode 1, and clock signal B common to circuit blocks 100, 200, and 300 in the case of mode 2, to the buffer stages of the buffer tree.

Circuit block 200 is the buffer tree that has the next-largest number of buffer stages, and performs distribution to some areas of the semiconductor integrated circuit. A clock signal from the supply source is input to a mode switching selector 201, and this mode switching selector 201 distributes clock signal A2 in the case of mode 1, and common clock signal B in the case of mode 2, to the buffer stages of the buffer tree.

Circuit block 300 does not have any buffers in this example, but still performs distribution to some areas of the semiconductor integrated circuit. A clock signal from the supply source is input to a mode switching selector 301, and this mode switching selector 301 outputs clock signal A3 in the case of mode 1, and common clock signal B in the case of mode 2, directly to an output pin 302.

Here, in the case of mode 2, common clock signal B is supplied to circuit blocks 100, 200, and 300. In circuit block 100, there are many buffer stages, the depth of the buffer stages as far as which the clock signal from mode switching selector 101 is supplied is great, and the number of fanout branches of each buffer is large, and therefore the delay value up to a buffer (buffer stage) at which a clock signal from mode switching selector 101 is actually used is large.

On the other hand, in circuit block 200 there are few buffer stages, the depth of the buffer stages is shallow, and the number of fanout branches of each buffer is small, and therefore the delay value up to a buffer (buffer stage) at which a clock signal from mode switching selector 201 is actually used is small. In circuit block 300, there are no buffers, and therefore the delay value from mode switching selector 301 to output to external pin 302 is small.

Thus, in a clock distribution circuit, delay adjustment buffers are inserted in the clock signal supply paths from the supply source to the mode switching selectors, and clock skew regulation is performed by reducing the difference of the delay values of clock signals after leaving the mode switching selectors of the respective circuit blocks. To be specific, taking the largest delay value of circuit block 100 as a basis, delay adjustment buffers 210 through 212 are inserted between the supply source and mode switching selector 201, and delay adjustment buffers 310 through 314 are inserted between the supply source and mode switching selector 301.

In delay adjustment buffers 210 through 212 and 310 through 314, the number of fanout branches is "1" and the load capacity is small. On the other hand, in circuit block 100 that determines the number of delay adjustment buffer insertions, the the number of fanout branches of each buffer is large, and the load capacity is large. To obtain a delay value equal to that of circuit block 100, it is necessary to insert in circuit block 200 more delay adjustment buffers 210 through 212 than that number of buffers, and to insert in circuit block 300 more delay adjustment buffers 310 through 314 than that number of buffers. As a result, a difference arises in the final number of buffer stages of circuit block 200 from the supply source with respect to the final number of buffer stages of circuit block 100 from the supply source. Similarly, a difference also arises in the final number of buffer stages of circuit block 300 from the supply source.

When temperature variations or voltage variations occur, a difference in the number of buffer stages produces variation in clock skew. In general, in the case of high temperature and low voltage, the clock signal path wiring delay increases and the buffer transit delay (cell delay) decreases. On the other hand, in the case of low temperature and high voltage, the wiring delay decreases and the buffer transit delay increases. That is to say, even if delay adjustment buffers 210 through 212 and 310 through 314 are inserted and the delay values of circuit blocks 100, 200, and 300 are made uniform in an environment of normal temperature and normal voltage, clock skew due to differences in the number of buffer stages is generated by temperature variations and voltage variations.

In above-mentioned Patent Literature 1, a clock distribution circuit is proposed whereby the number of buffers and number of buffer stages are made uniform in all clock signal supply system circuit blocks, and even if temperature variations or voltage variations occur, clock skew does not occur between buffer stages of the same level of different circuit blocks.

However, an actual implementation method has not been established in a computer aided design system used in the development and manufacturing stages of a semiconductor integrated circuit. Actually, in order to make the number of buffers and number of buffer stages uniform, it is necessary to calculate the wiring delay of a part for which the delay value has been adjusted by delay adjustment buffer insertion, route wiring based on the result of this calculation, and perform delay value regulation appropriate to uniformity of the number of buffer stages.

Therefore, reducing clock skew without experiencing the effects of temperature variations or voltage variations involves great effort, such as wiring delay calculation and wiring routing, and at the same time there is a high degree of dependency in handling the task by routing wiring whose wiring delay is affected by temperature variations and voltage variations, making it impossible to reduce clock skew satisfactorily.

SUMMARY OF THE INVENTION

The present invention has been implemented taking into account the points described above and it is an object of the present invention to provide a semiconductor integrated circuit and a manufacturing method thereof that enable clock skew to be reduced without requiring great effort and without being affected by temperature variations or voltage variations.

According to an aspect of the invention, a semiconductor integrated circuit of the present invention employs a configuration comprising a clock distribution circuit that has a first circuit block in which a plurality of first buffer stages are arranged according to a buffer tree structure and a clock signal output from a first selector is distributed to that plurality of first buffer stages, and a second circuit block in which second buffer stages comprising fewer stages compared with the first circuit block are arranged according to a buffer tree structure and a clock signal output from the first selector is distributed to second buffer stages via the first buffer stage and a second selector.

According to another aspect of the invention, a semiconductor integrated circuit manufacturing method of the present invention employs a configuration whereby a clock distribution circuit is manufactured by providing a step of deploying a first circuit block in which a plurality of first buffer stages are arranged according to a buffer tree structure and a clock signal output from a first selector is distributed to that plurality of first buffer stages, a step of deploying a second circuit block in which second buffer stages comprising fewer stages compared with the first circuit block are arranged according to a buffer tree structure and a clock signal output from a second selector is distributed to second buffer stages, and a step of placing connecting wiring that supplies a clock signal from the first selector to the second selector via the first buffer stages.

BRIEF DESCRIPTION OF THE DRAWINGS

The above and other objects and features of the invention will appear more fully hereinafter from a consideration of the following description taken in conjunction with the accompanying drawing wherein one example is illustrated by way of example, in which.

DESCRIPTION OF THE PREFERRED EMBODIMENT

In an embodiment of the present invention, for example, in a clock distribution circuit a distribution path of some clock signals that pass through buffer stages from a selector of a circuit block with many buffer stages is used, and a distribution path of clock signals to buffer stages of a circuit block with few buffer stages is constructed.

With reference now to the accompanying drawings, an embodiment of the present invention will be explained in detail below.

Figure 1:
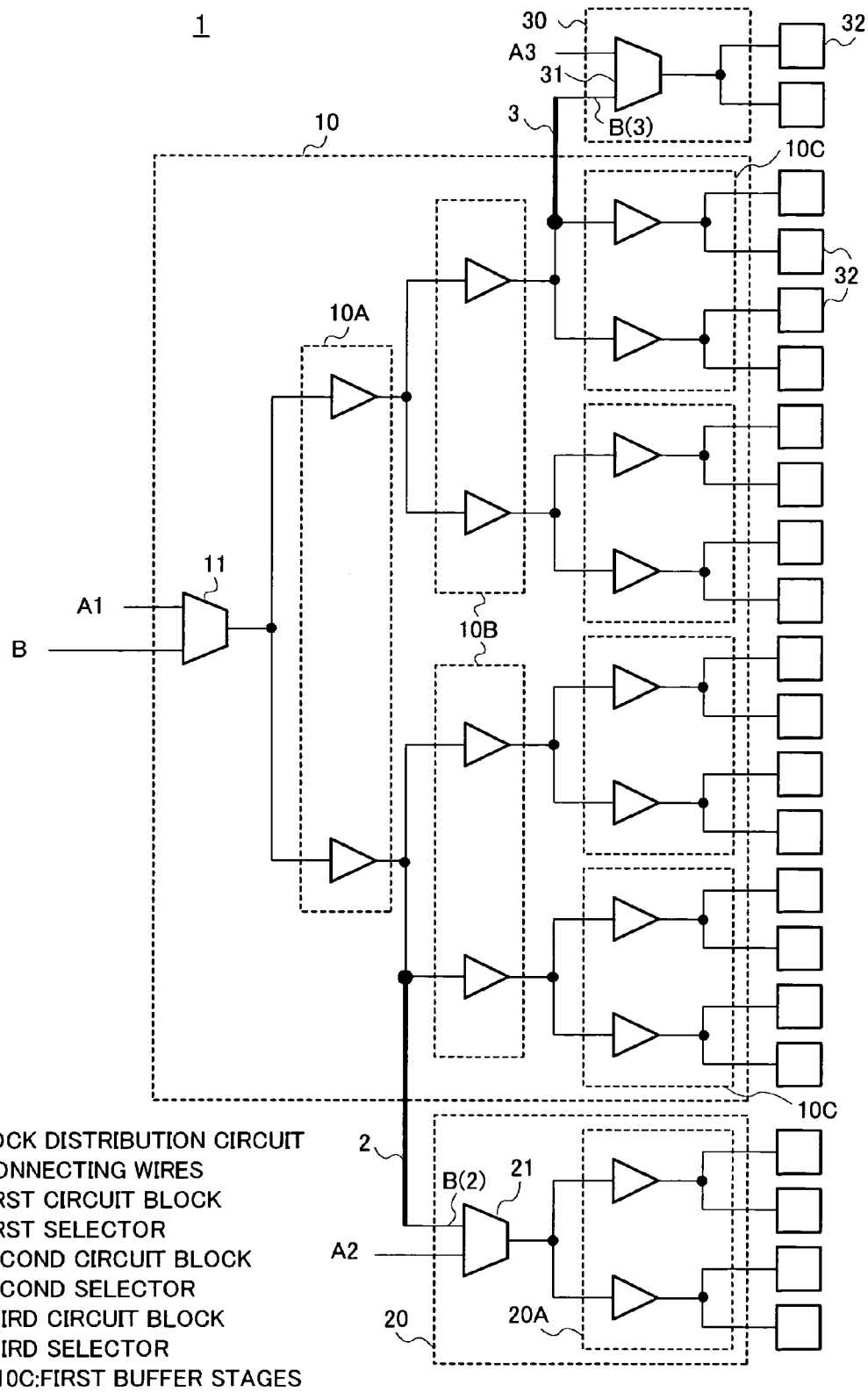
FIG. 1 is a circuit configuration diagram of a semiconductor integrated circuit provided with a clock distribution circuit according to an embodiment of the present invention.

As shown in FIG. 1, a clock distribution circuit 1 installed in a semiconductor integrated circuit according to this embodiment has a first circuit block 10 in which multi-stage first buffer stages 10A, 10B, and 10C are arranged according to a buffer tree structure and a clock signal output from a first selector 11 is distributed to multi-stage first buffer stages 10A through 10C, and a second circuit block 20 in which a second buffer stage 20A of fewer stages than first circuit block 10 is arranged according to a buffer tree structure and a clock signal output from first selector 11 is distributed to second buffer stage 20A via first buffer stage 10A and a second selector 21. Furthermore, clock distribution circuit 1 has a third circuit block 30 that outputs a clock signal directly from a third selector 31 to pins 32. Here, pins 32 correspond to external pins (bonding pads) of a semiconductor integrated circuit, pins of a logic block or memory block installed in a semiconductor integrated circuit, or the like.

First selector 11 of first circuit block 10 is a mode switching selector. This first selector 11 inputs a clock signal A1 in mode 1, inputs a clock signal B in mode 2, and distributes either clock signal A1 or B to first buffer stages 10A through 10C. Mode 1 is a mode in which clock signal A1 is inputted to first circuit block 10, a clock signal A2 is input to second circuit block 20, and a clock signal A3 is inputted to third circuit block 30. Mode 2 is a mode in which common clock signal B that unifies the entire clock system is inputted to first circuit block 10, second circuit block 20, and third circuit block 30.

First buffer stages 10A through 10C are circuit cells for constructing a semiconductor integrated circuit logic block or the like, and here each buffer stage is composed of flip-flops connected in parallel.

Second selector 21 of second circuit block 20 is also a mode switching selector. Second selector 21 inputs clock signal A2 in mode 1, inputs clock signal B(2) in mode 2, and distributes either clock signal A2 or B(2) to second buffer stage 20A.

In the same way as each of first buffer stages 10A through 10C, second buffer stage 20A is composed of flip-flops connected in parallel. Here, while first circuit block 10 is composed of three stages first buffer stages 10A through 10C, second circuit block 20 is composed of one stage second buffer stage 20A that is a smaller number of stages than the number of buffer stages of first circuit block 10.

One input (the clock signal B(2) input) of second selector 21 is connected electrically to an output of initial stage first buffer stage 10A of first circuit block 10, in other words, an input of a next stage first buffer stage 10B via a connecting wire 2. In mode 2, clock signal B is not inputted directly to second selector 21, but clock signal B inputted to and outputted from first selector 11 is inputted to second selector 21 via first buffer stage 10A and connecting wire 2 as clock signal B(2). That is to say, clock signal B(2) is generated using part of the clock signal B distribution path passing from first selector 11 via first buffer stage 10A, connecting wire 2, and second selector 21 so that, viewed from first selector 11, the delay value until reaching second buffer stage 20A of second circuit block 20 from first selector 11 after passing through first buffer stage 10A, connecting wire 2, and second selector 21, and the delay value until reaching first buffer stage 10C existing at the same level as second buffer stage 20A from first selector 11 after passing through first buffer stages 10A and 10B, are equal.

Conditions such as the number of fanout branches, parasitic capacitance, and parasitic resistance are set identically for first buffer stages 10A through 10C and second buffer stage 20A, and therefore the delay value added to the clock signal each time a buffer stage is passed is the same.

Third selector 31 of third circuit block 30 is also a mode switching selector. Third selector 31 inputs clock signal A3 in mode 1, inputs clock signal B(3) in mode 2, and distributes either clock signal A3 or B(3) to pins 32. Third circuit block 30 has no buffer stage.

One input (the clock signal B(3) input) of third selector 31 is connected electrically to an output of a next stage first buffer stage 10B of first circuit block 10, in other words, the input of a final stage first buffer stage 10C via a connecting wire 3. In mode 2, as with second selector 21, clock signal B is not inputted directly to third selector 31, but clock signal B inputted to and outputted from first selector 11 is input to third selector 31 via first buffer stages 10A and 10B and connecting wire 3 as clock signal B(3). That is to say, clock signal B(3) is generated using part of the clock signal B distribution path passing from first selector 11 via first buffer stages 10A and 10B, connecting wire 3, and third selector 31 so that, viewed from first selector 11, the delay value until reaching pins 32 output from third circuit block 30 from first selector 11 after passing through first buffer stages 10A and 10B, connecting wire 3, and third selector 31, and the delay value of clock signal B until reaching pins 32 from first selector 11 after passing through first buffer stages 10A, 10B, and 10C, are equal.

Figure 2:
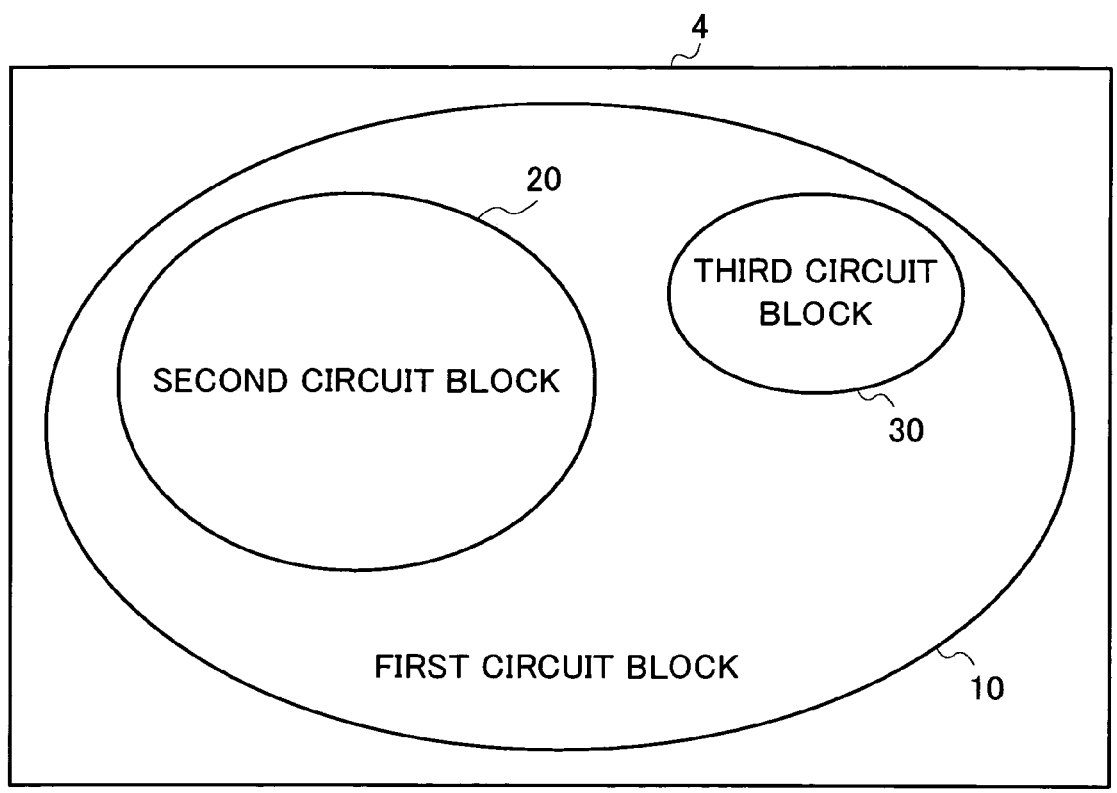
FIG. 2 is a drawing showing the buffer stage distribution state of the clock distribution circuit shown in FIG. 1.

FIG.2 shows the distribution state in a semiconductor integrated circuit 4 of the first circuit block 10, second circuit block 20, and third circuit block 30 buffer stages. First buffer stages 10A through 10C of first circuit block 10 have the highest placement count, greatest buffer stage depth, and widest distribution range in semiconductor integrated circuit 4. Second buffer stage 20A of second circuit block 20, and third circuit block 30, each have a small placement count, shallow buffer stage depth, and narrow distribution range in semiconductor integrated circuit 4.

Figure 3:
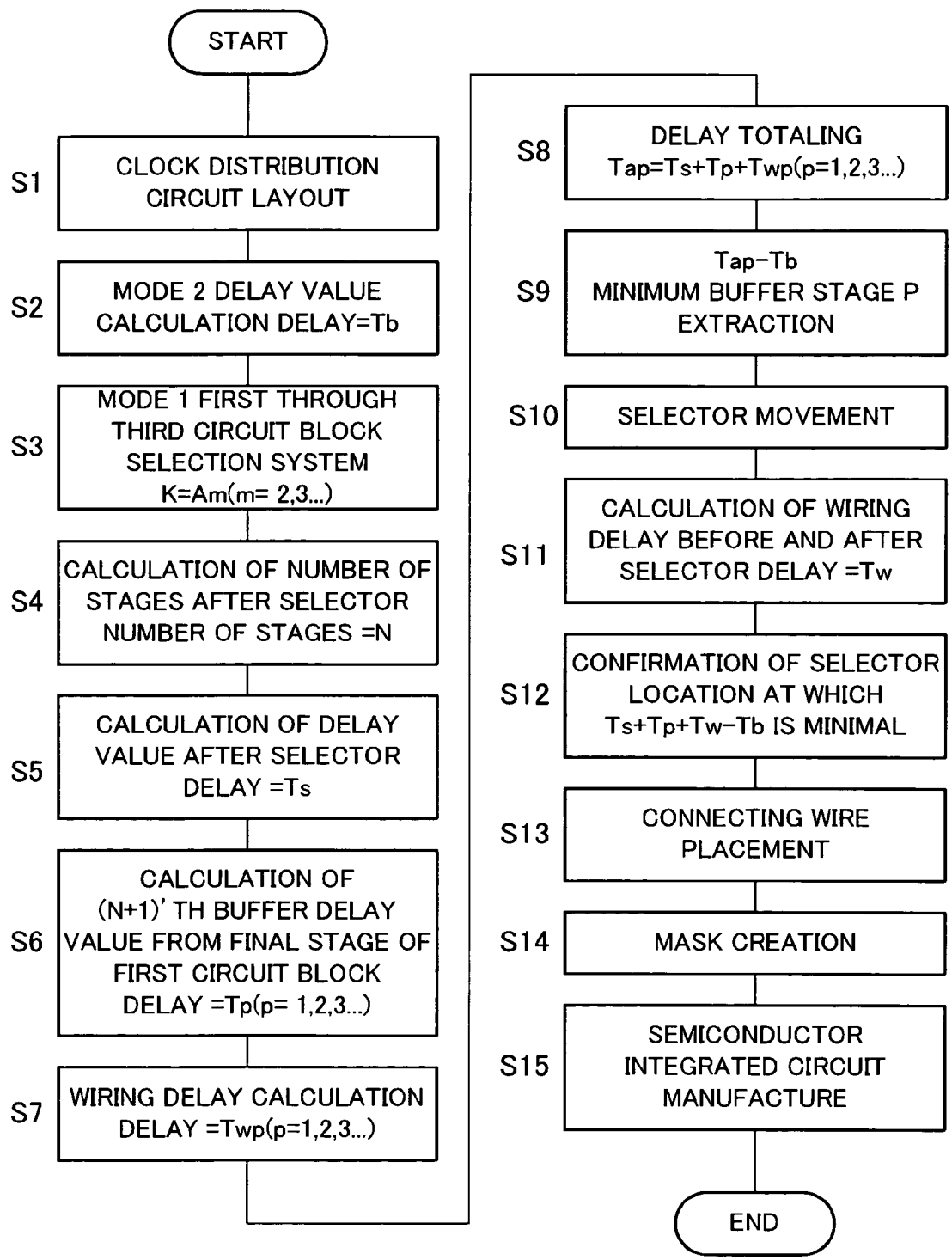
FIG. 3 is a flowchart explaining the manufacturing method of a semiconductor integrated circuit provided with the clock distribution circuit shown in FIG. 1.
Figure 4:
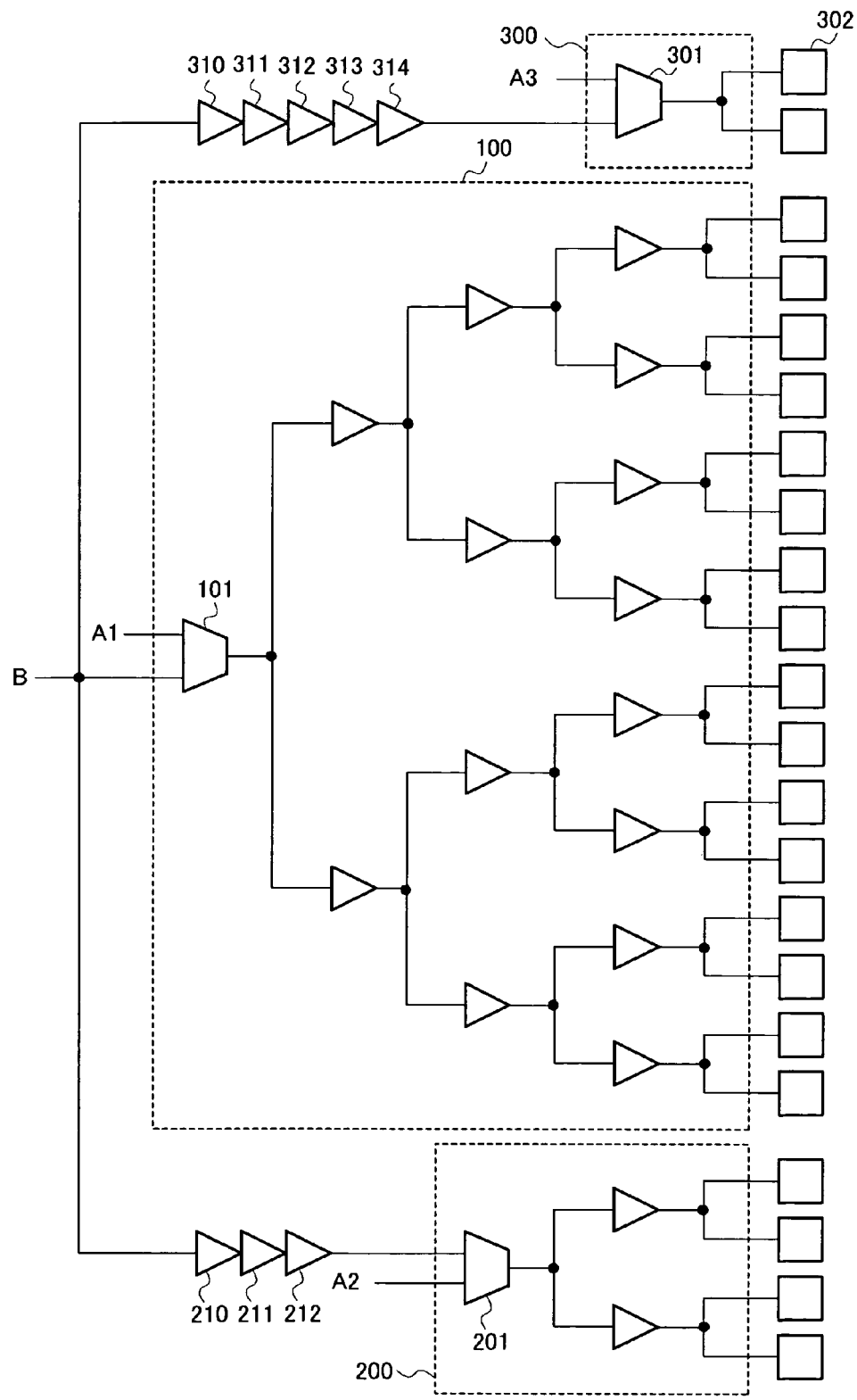
FIG. 4 is a circuit configuration diagram of a conventional clock distribution circuit.

The manufacturing method of a semiconductor integrated circuit equipped with above-described clock distribution circuit 1 will now be described using FIG. 3.

First, using a computer aided design system, as shown in step S1, clock distribution circuit 1 equipped with first circuit block 10 that has first selector 11 and multi-stage first buffer stages 10A through 10C, second circuit block 20 that has second selector 21 and second buffer stage 20A, and third circuit block 30 that has third selector 31, is laid out on a substrate (not shown) forming a semiconductor integrated circuit (S1). The processing here is computer aided design system processing, and processing for arranging circuit blocks on the substrate is processing that arranges data corresponding to circuit blocks in memory space corresponding to the substrate surface.

As shown in step S2, calculation is performed to find the delay value (Tb) until clock signal B actually reaches a buffer stage to which clock signal B is distributed from the clock signal B supply source in mode 2 in which common clock signal B is input to first selector 11, second selector 21, and third selector 31.

As shown in step S3, selection is made of second circuit block 20 and third circuit block 30 with few buffer stages and a narrow distribution range in semiconductor integrated circuit 4 in mode 1 in which clock signal A1 is input to first selector 11, clock signal A2 is input to second selector 21, and clock signal A3 is input to third selector 31 (system K=Am (m=2, 3, ... )).

As shown in step S4, the number of stages of first buffer stages 10A through 10C subsequent to first selector 11 in first circuit block 10, the number of stages of second buffer stage 20A subsequent to second selector 21 in second circuit block 20, and the number of buffer stages subsequent to third selector 31 in third circuit block 30 are calculated (number of stages=N). Then, as shown in step S5, the delay value subsequent to first selector 11 in first circuit block 10, the delay value subsequent to second selector 21 in second circuit block 20, and the delay value subsequent to third selector 31 in third circuit block 30 are calculated (delay value=Ts).

As shown in step S6, calculation is performed to find the (N+1)'th first buffer stage from the final stage when the number of stages of first buffer stages 10A through 10C with the most buffer stages and widely distributed in semiconductor integrated circuit 4 in mode 1 is designated N (delay value Tp (p=1, 2, 3, ... )).

As shown in step S7, the wiring delay when the output of the (N+1)'th first buffer stage from the final stage of first circuit block 10 is connected to the input of second selector 21 of second circuit block 20 (Twp (p=1, 2, 3, ... )), and the wiring delay when the output of the (N+1)'th first buffer stage from the final stage of first circuit block 10 is connected to the input of third selector 31 of third circuit block 30 are calculated.

As shown in step S8, previously calculated delay values Ts and Tp, and wiring delay Twp, are added, and delay value Tap (p=1, 2, 3, ... ) in mode 2 when first buffer stage output is connected to second selector 21 input and first buffer stage output is connected to third selector 31 input is calculated.

As shown in step S9, extraction is performed of the first buffer stage (P) of first circuit block 10 for which the difference (Tap–Tb) between the calculated delay value Tap and first circuit block 10 delay value Tb in mode 2 is a minimum.

Then, as shown in step S10, second selector 21 and third selector 31 placement position movement is performed with respect to the extracted first buffer stage (P). This placement position movement brings second selector 21 input into appropriate proximity to first buffer stage 10A output of first circuit block 10, and brings third selector 31 input into appropriate proximity to first buffer stage 10B output of first circuit block 10, and shortens the length of connecting wires 2 and 3, enabling the effects of wiring delay to be reduced.

As shown in step S11, after the second selector 21 and third selector 31 placement position movements, wiring delay Tw before and after second selector 21 and before and after third selector 31 is calculated.

As shown in step S12, after the second selector 21 and third selector 31 placement position movements, the positions of second selector 21 and third selector 31 are confirmed for which the difference (Ts+Tp+Tw–Tb) between the second circuit block 20 and third circuit block 30 delay value and the first circuit block 10 delay value in mode 1 is a minimum.

Then, as shown in step S13, connecting wire 2 connecting the first buffer stage (P=10A) output extracted in step S9 and second selector 21, and connecting wire 3 connecting the first buffer stage (P=10B) output and third selector 31, are placed.

Following this, as shown in step S14, based on these data created by the computer aided design system, a manufacturing mask is created that is used in the actual semiconductor integrated circuit manufacturing process.

By actually carrying out a manufacturing process using this manufacturing mask, as shown in step S15, it is possible to manufacture and finish a semiconductor integrated circuit equipped with a clock distribution circuit 1 in which connecting wires 2 and 3 designed in step S13 are placed.

Thus, according to this embodiment, use is made of part of the distribution path of a clock signal distributed from first selector 11 to first buffer stages 10A through 10C in first circuit block 10 of clock distribution circuit 1, and a clock signal can be distributed from first selector 11 to second buffer stage 20A of the same level of second circuit block 20 via first buffer stage 10A and second selector 21. That is to say, when clock skew varies due to temperature variations or voltage variations in the clock signal distribution path of first circuit block 10, clock skew varies similarly in the clock signal distribution path of second circuit block 20. Furthermore, the delay values for each of first buffer stages 10A through 10C of first circuit block 10 and the delay values for each second buffer stage 20A of second circuit block 20 are equal, making it possible to calculate easily the number of stages of first buffer stages 10A through 10C between first selector 11 and second selector 21.

As described above, according to a semiconductor integrated circuit of the present invention, a configuration is employed comprising a clock distribution circuit that has a first circuit block in which a plurality of first buffer stages are arranged according to a buffer tree structure and a clock signal output from a first selector is distributed to that plurality of first buffer stages, and a second circuit block in which second buffer stages comprising fewer stages compared with the first circuit block are arranged according to a buffer tree structure and a clock signal output from the first selector is distributed to second buffer stages via the first buffer stage and a second selector, whereby use is made of part of the distribution path of a clock signal distributed from a first selector to first buffer stages in the first circuit block, and a clock signal can be distributed from the first selector to a second buffer stage of the same level of a second circuit block via a first buffer stage and second selector. That is to say, when clock skew varies due to temperature variations or voltage variations in the clock signal distribution path of the first circuit block, clock skew varies similarly in the clock signal distribution path of the second circuit block. Furthermore, the delay values for each first buffer stage of the first circuit block and the delay values for each second buffer stage of the second circuit block are equal, making it possible to calculate easily the number of stages of the first buffer stages between the first selector and second selector.

Also, a semiconductor integrated circuit of the present invention employs a configuration comprising a clock distribution circuit in which the delay value of a clock signal reaching a second buffer stage of a second circuit block from the first selector via the first buffer stage and second selector, and the delay value of a clock signal reaching a first buffer stage of a first circuit block from the first selector at the same level as this second buffer stage, are equal.

Furthermore, a semiconductor integrated circuit manufacturing method of the present invention employs a configuration whereby a clock distribution circuit is manufactured by providing a step of deploying a first circuit block in which a plurality of first buffer stages are arranged according to a buffer tree structure and a clock signal output from a first selector is distributed to that plurality of first buffer stages, a step of deploying a second circuit block in which second buffer stages comprising fewer stages compared with the first circuit block are arranged according to a buffer tree structure and a clock signal output from a second selector is distributed to second buffer stages, and a step of placing a connecting wire that supplies a clock signal from the first selector to the second selector via the first buffer stages, whereby after the first circuit block and second circuit block have been placed, clock signal delay values can be made equal in first and second buffer stages of the same level simply by placing a connecting wire that supplies a clock signal from the first selector to the second selector via a first buffer stage.

Also, a semiconductor integrated circuit manufacturing method of the present invention employs a configuration wherein the step of placing a connecting wire comprises a step of calculating the difference between the delay value of a clock signal reaching a second buffer stage of a second circuit block from the second selector and the delay value of a clock signal reaching a first buffer stage of the first circuit block from the first selector, and a step of placing a connecting wire that equalizes that delay value difference between the first circuit block first buffer stage output and second selector input.

Thus, according to the present invention, it is possible to provide a semiconductor integrated circuit equipped with a clock distribution circuit that enables clock skew to be reduced without requiring great effort and without being affected by temperature variations or voltage variations, and a manufacturing method thereof.

As a result, a semiconductor integrated circuit equipped with a clock distribution circuit according to the present invention and a manufacturing method thereof have an effect of enabling clock skew to be reduced without requiring great effort and without being affected by temperature variations or voltage variations, and are particularly effective for a systematized semiconductor integrated circuit in which a plurality of semiconductor integrated circuits are mounted on a wiring board that requires such an effect, and a manufacturing method thereof.

The present invention is not limited to the above-described embodiment, and various variations and modifications may be possible without departing from the scope of the present invention.

This application is based on Japanese Patent Application No. 2003-420033 filed on Dec. 17, 2003, the entire content of which is expressly incorporated by reference herein.

What is claimed is:

1. A semiconductor integrated circuit equipped with a clock distribution circuit comprising:
    a first circuit block in which a plurality of first buffer stages are arranged according to a buffer tree structure and a clock signal output from a first selector is distributed to said plurality of first buffer stages; and
    a second circuit block in which second buffer stages of fewer stages compared with said first circuit block are arranged according to a buffer tree structure and the clock signal output from said first selector is distributed to a second buffer stage via said first buffer stage and a second selector.

2. The semiconductor integrated circuit equipped with a clock distribution circuit according to claim 1, wherein a delay value of a clock signal reaching a second buffer stage of a second circuit block from said first selector via said first buffer stage and second selector, and a delay value of a clock signal reaching a first buffer stage of a first circuit block from said first selector at an identical level to this second buffer stage, are equal.

3. A manufacturing method of a semiconductor integrated circuit equipped with a clock distribution circuit comprising:
    a step of placing a first circuit block in which a plurality of first buffer stages are arranged according to a buffer tree structure and a clock signal output from a first selector is distributed to said plurality of first buffer stages;

a step of placing a second circuit block in which second buffer stages comprising fewer stages compared with said first circuit block are arranged according to a buffer tree structure and a clock signal output from a second selector is distributed to second buffer stages; and a step of placing a connecting wire that supplies the clock signal from said first selector to said second selector via said first buffer stages.

4. The manufacturing method of a semiconductor integrated circuit equipped with a clock distribution circuit according to claim 3, wherein said step of placing a connecting wire comprises:

a step of calculating a difference between a delay value of a clock signal reaching a second buffer stage of a second circuit block from said second selector and a delay value of a clock signal reaching a first buffer stage of said first circuit block from said first selector at an identical level to this first buffer stage, and;

a step of placing a connecting wire that equalizes said delay value difference between said first circuit block first buffer stage output and second selector input.

* * * * *